(12) United States Patent
Hong

(10) Patent No.: US 10,382,041 B2
(45) Date of Patent: Aug. 13, 2019

(54) BUFFER CIRCUIT

(71) Applicant: SK hynix Inc., Icheon-si, Gyeonggi-do (KR)

(72) Inventor: Gi Moon Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/037,451

(22) Filed: Jul. 17, 2018

(65) Prior Publication Data
US 2019/0199352 A1   Jun. 27, 2019

(30) Foreign Application Priority Data

Dec. 21, 2017   (KR) ........................ 10-2017-0176619

(51) Int. Cl.
*H03K 19/0185*   (2006.01)
*H04L 25/02*   (2006.01)

(52) U.S. Cl.
CPC . *H03K 19/018528* (2013.01); *H04L 25/0282* (2013.01); *H04L 25/0294* (2013.01)

(58) Field of Classification Search
CPC combination set(s) only.
See application file for complete search history.

(56) References Cited

U.S. PATENT DOCUMENTS

| | | | |
|---|---|---|---|
| 5,298,810 A | 3/1994 | Scott et al. | |
| 6,774,678 B2 | 8/2004 | Martin et al. | |
| 6,856,178 B1 * | 2/2005 | Narayan | H03K 19/018585 326/87 |
| 7,598,779 B1 * | 10/2009 | Wang | H03K 19/018528 327/108 |
| 8,653,856 B2 * | 2/2014 | Piepenstock | H03K 19/018528 326/115 |
| 2003/0193350 A1 * | 10/2003 | Chow | H03K 19/018585 326/83 |
| 2005/0285629 A1 * | 12/2005 | Hein | H03K 19/018585 326/115 |
| 2007/0024320 A1 * | 2/2007 | De Laurentiis | H03F 3/45094 326/63 |
| 2008/0024177 A1 * | 1/2008 | Mao | H03K 19/018528 327/108 |
| 2010/0054324 A1 * | 3/2010 | Bulzacchelli | H04L 25/03057 375/233 |
| 2010/0117690 A1 * | 5/2010 | Doi | H03K 19/018528 327/108 |
| 2012/0074987 A1 * | 3/2012 | Piepenstock | H03K 19/018528 327/108 |
| 2013/0099822 A1 * | 4/2013 | Cao | H03K 19/018521 326/68 |
| 2014/0104088 A1 * | 4/2014 | Nagasawa | H03K 19/09432 341/144 |

(Continued)

*Primary Examiner* — Adam D Houston
(74) *Attorney, Agent, or Firm* — William Park & Associates LTD.

(57) ABSTRACT

A buffer circuit may include an input unit coupled among first and second output nodes and a common node. The input unit may be configured to change voltage levels of first and second output nodes based on an input signal. The buffer circuit may generate an output signal swinging between a voltage and a first voltage in a first operation mode, and may generate an output signal swinging between the voltage and a second voltage having a different level from the first voltage in a second operation mode.

32 Claims, 8 Drawing Sheets

(56) References Cited

U.S. PATENT DOCUMENTS

| | | | |
|---|---|---|---|
| 2015/0035563 A1* | 2/2015 | Nazemi | H03K 19/018507 326/68 |
| 2015/0116005 A1* | 4/2015 | Chaahoub | H03K 3/012 327/108 |
| 2015/0381178 A1* | 12/2015 | Nguyen | H03K 3/017 326/68 |
| 2016/0099709 A1* | 4/2016 | Chang | H03K 19/0826 326/68 |

* cited by examiner

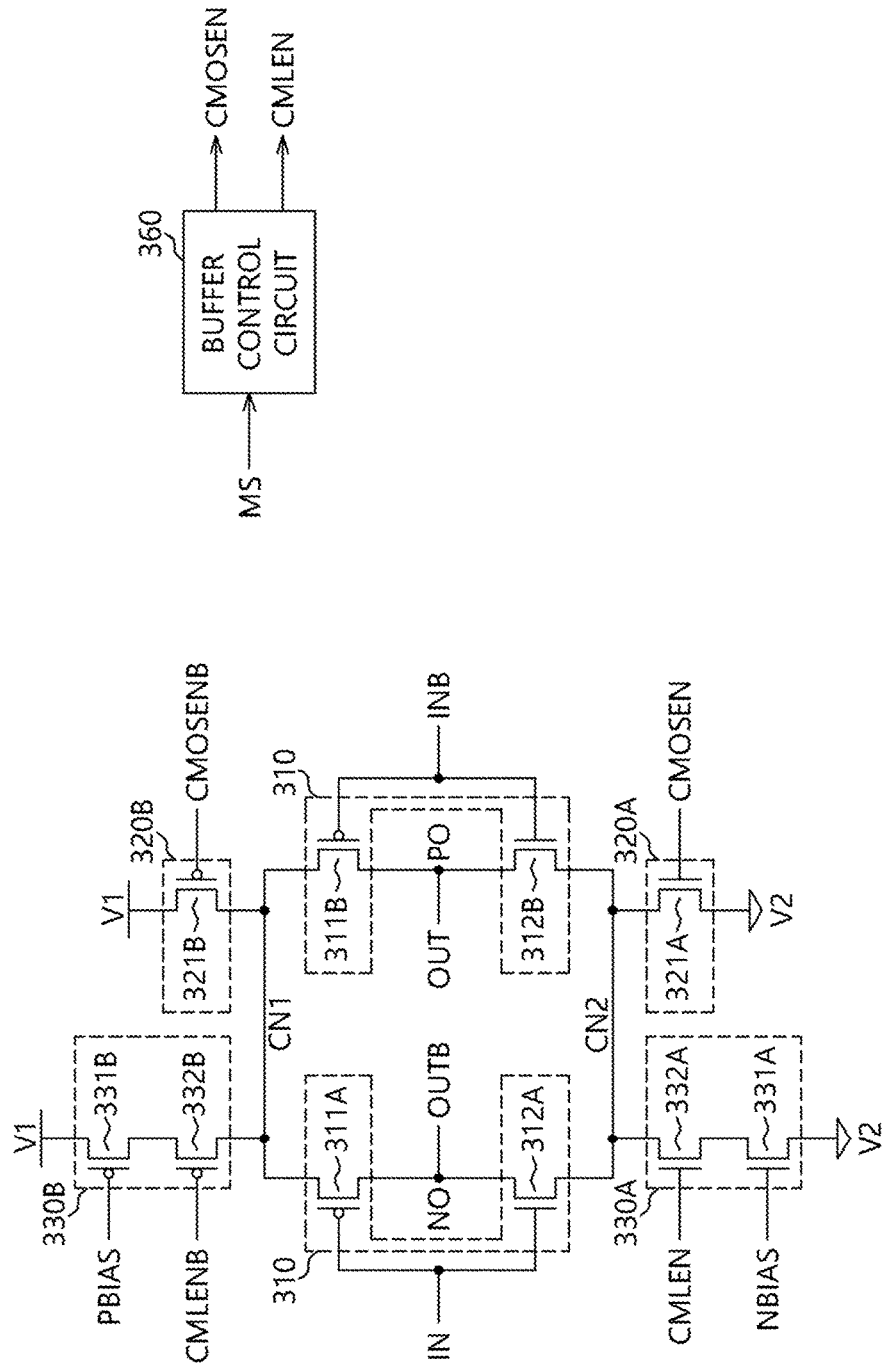

BUFFER CIRCUIT

CROSS-REFERENCES TO RELATED APPLICATION

The present application claims priority under 35 U.S.C. § 119(a) to Korean application number 10-2017-0176619, filed on Dec. 21, 2017, in the Korean Intellectual Property Office, which is incorporated herein by reference in its entirety as set forth in full.

BACKGROUND

1. Technical Field

Various embodiments may generally relate to a semiconductor technology and, more particularly, to a buffer circuit relating to the buffering of a signal.

2. Related Art

An electronic device includes a lot of electronic elements, and a computer system includes lots of semiconductor apparatuses comprising a semiconductor. Semiconductor apparatuses included in a computer system may communicate with one another by transmitting and receiving a clock and data. Therefore, most semiconductor apparatuses may include a buffer circuit configured to receive a clock and data provided from an external apparatus.

In general, buffers of current mode logic (CML) type and CMOS type are used. The CML type buffer may promptly operate by limiting a swing width of an output signal. The CMOS type buffer may generate an output signal of a full swing width but may operate slowly. As an operation speed of the semiconductor apparatus becomes improved, the semiconductor apparatus may provide a signal having a small amplitude and a high frequency. Therefore, the semiconductor apparatus may include both of the CML type buffer capable of operating promptly and the CMOS type buffer configured to relatively slowly operate in order to receive a signal provided from an external apparatus.

SUMMARY

In an embodiment of the present disclosure, a buffer circuit may include an input unit configured to electrically couple a first output node and a second output node to a common node based on an input signal. The buffer circuit may be configured to provide a high voltage to one of the first and second output nodes based on the input signal in a first operation mode, and may be configured to provide a first low voltage to the common node in the first operation mode. The buffer circuit may be configured to provide the high voltage to both of the first and second output nodes in a second operation mode, and may be configured to provide a second low voltage having a different level from the first low voltage to the common node in the second operation mode.

In an embodiment of the present disclosure, a buffer circuit may include an input unit electrically coupled between a first output node, a second output node, and a common node. The input unit may be configured to change voltage levels of the first and second output nodes based on an input signal. The buffer circuit may be configured to provide a first high voltage to the common node in a first operation mode, and may be configured to provide a low voltage to one of the first and second output nodes based on the input signal in the first operation mode. The buffer circuit may be configured to provide a second high voltage having a different level from the first high voltage to the common node in a second operation mode, and may be configured to provide the low voltage to both of the first and second output nodes in the second operation mode.

In an embodiment of the present disclosure, a buffer circuit may include an input unit electrically coupled between a first output node, a second output node, and a common node. The input unit may be configured to change voltage levels of the first and second output nodes based on an input signal. The buffer circuit may include a gating unit configured to provide a high voltage to the first and second output nodes based on a first operation mode signal and the input signal.

In an embodiment of the present disclosure, a buffer circuit may include an input unit electrically coupled between first and second common nodes. The input unit may be configured to change voltage levels of first and second output nodes based on an input signal. The buffer circuit may be configured to provide one of a first high voltage and a second high voltage having a different level from the first high voltage to the first common node according to an operation mode, and may be configured to provide one of a first low voltage and a second low voltage having a different level from the first low voltage to the second common node according to the operation mode.

BRIEF DESCRIPTION OF THE DRAWINGS

FIG. 8 is a diagram illustrating an example of a configuration of a hybrid buffer circuit in accordance with an embodiment of the present disclosure.

DETAILED DESCRIPTION

Hereinafter, a semiconductor apparatus according to the present disclosure will be described below with reference to the accompanying drawings through examples of embodiments.

Figure 1:
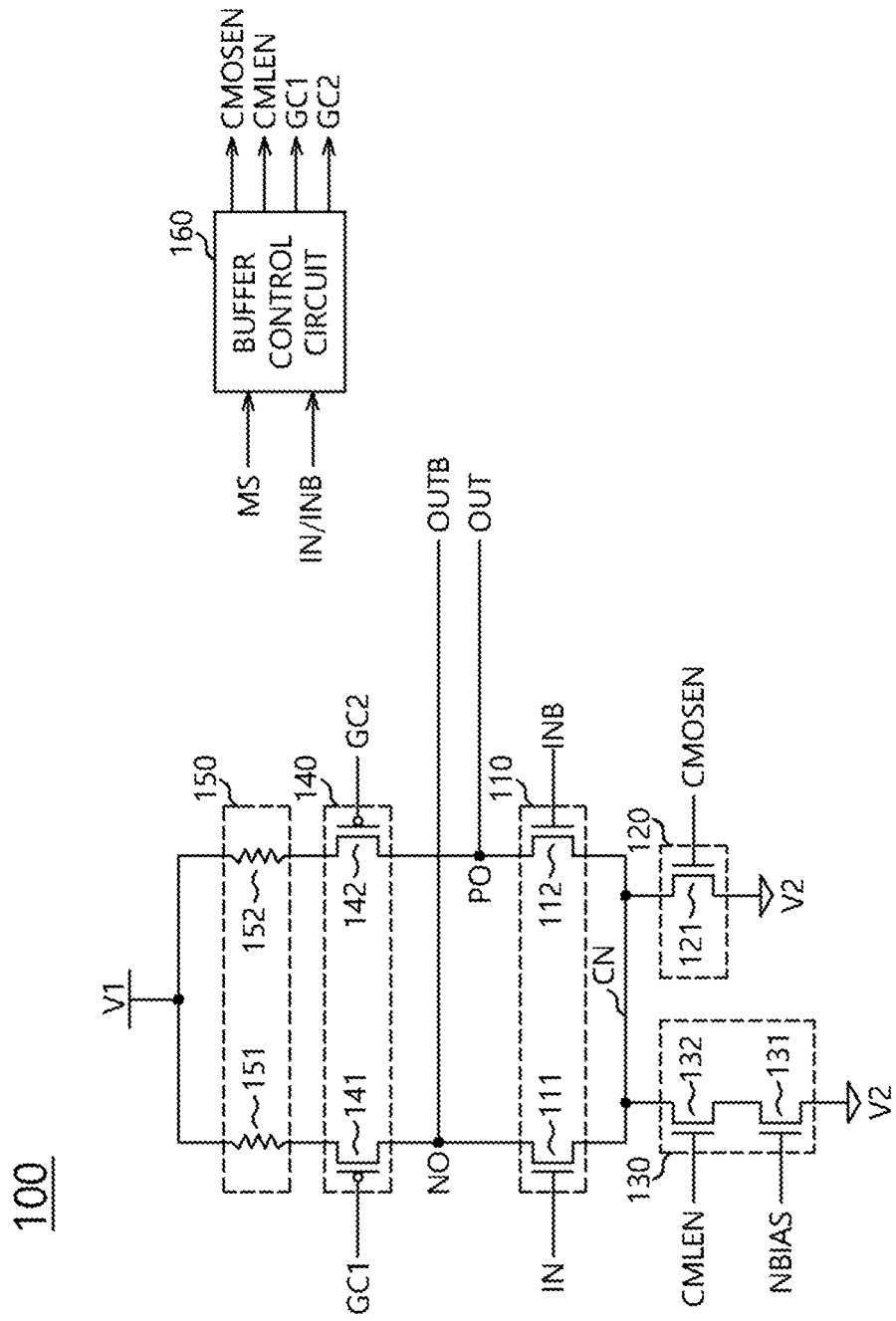
FIG. 1 is a diagram illustrating an example of a configuration of a hybrid buffer circuit in accordance with an embodiment of the present disclosure.

FIG. 1 is a diagram illustrating an example of a configuration of a hybrid buffer circuit 100 in accordance with an embodiment of the present disclosure. Referring to FIG. 1, the hybrid buffer circuit 100 may operate in a first operation mode and a second operation mode. The first operation mode may be a CMOS operation mode, and the second operation mode may be a CML operation mode. The hybrid buffer circuit 100 may operate as a CMOS type buffer in the first operation mode, and may operate as a CML type buffer in the second operation mode. The hybrid buffer circuit 100 may operate in a first operation mode and a second operation mode depending on, for example, an operation speed of a semiconductor apparatus including the hybrid buffer circuit 100. For example, the hybrid buffer circuit 100 may operate in the first operation mode when the semiconductor apparatus operates slowly, and may operate in the second operation mode when the semiconductor apparatus operates fast.

The hybrid buffer circuit 100 may be provided with a first power voltage V1 and a second power voltage V2, and may generate output signals OUT and OUTB by receiving input signals IN and INB. The first power voltage V1 may have a higher level than the second power voltage V2. For example, the first power voltage V1 may be a power voltage provided from an external power source or may be an internal voltage generated within the semiconductor apparatus. For example, the second power voltage V2 may be a ground voltage. The hybrid buffer circuit 100 may generate the output signals OUT and OUTB having a first swing width in the first operation mode and the output signals OUT and OUTB having a second swing width in the second operation mode. The second swing width may be less than the first swing width. For example, the first swing width may be the level difference between the first power voltage V1 and the second power voltage V2, and the second swing width may be the level difference between the first power voltage V1 and a low voltage having a higher level than the second power voltage V2. In an embodiment, the second swing width may be the level difference between a high voltage having a lower level than the first power voltage V1 and the second power voltage V2. In an embodiment, the second swing width may be the level difference between a high voltage having a lower level than the first power voltage V1 and a low voltage having a higher level than the second power voltage V2.

Referring to FIG. 1, the hybrid buffer circuit 100 may include an input unit 110. The input unit 110 may be electrically coupled between a first output node PO, a second output node NO, and a common node CN. The input unit 110 may receive the input signals IN and INB, and may electrically couple the first output node PO and the second output node NO to the common node CN based on the input signals IN and INB. The input unit 110 may change the voltage levels of the first output node PO and the second output node NO based on the input signals IN and INB. The positive output signal OUT may be generated through the first output node PO, and the complementary output signal OUTB through the second output node NO. The input signals IN and INB may be differential signals. The input signals IN and INB may include a positive input signal IN and a complementary input signal INB. The hybrid buffer circuit 100 may provide a high voltage to the first output node PO and the second output node NO based on the input signals IN and INB in the first operation mode in the first operation mode. The hybrid buffer circuit 100 may provide a first low voltage to the common node CN in the first operation mode. For example, the high voltage may have substantially the same level as the first power voltage V1. For example, the first low voltage may have substantially the same level as the second power voltage V2. Therefore, the hybrid buffer circuit 100 may generate, through the first output node PO and the second output node NO based on the input signals IN and INB, the output signals OUT and OUTB swinging between a high voltage having substantially the same level as the first power voltage V1 and the first low voltage having substantially the same level as the second power voltage V2 in the first operation mode.

The hybrid buffer circuit 100 may provide the high voltage to the first output node PO and the second output node NO regardless of the input signals IN and INB in the second operation mode. The hybrid buffer circuit 100 may provide a second low voltage to the common node CN in the second operation mode. For example, the second low voltage may have a higher level than the first low voltage. The second low voltage may have a level higher than the second power voltage V2 and lower than the first power voltage V1. Therefore, the hybrid buffer circuit 100 may generate, through the first output node PO and the second output node NO based on the input signals IN and INB, the output signals OUT and OUTB swinging between the high voltage having substantially the same level as the first power voltage V1 and a second low voltage having a higher level than the second power voltage V2 in the second operation mode.

The hybrid buffer circuit 100 may include a first switching element 111 and a second switching element 112. The first switching element 111 and the second switching element 112 may be N channel MOS transistors. The first switching element 111 may receive the positive input signal IN at its gate, may be electrically coupled to the second output node NO at its drain, and may be electrically coupled to the common node CN at its source. The second switching element 112 may receive the complementary input signal INB at its gate, may be electrically coupled to the first output node PO at its drain, and may be electrically coupled to the common node CN at its source.

Referring to FIG. 1, the hybrid buffer circuit 100 may further include a first low voltage supply unit 120 and a second low voltage supply unit 130. The first low voltage supply unit 120 may provide the first low voltage to the common node CN in the first operation mode. The first low voltage supply unit 120 may provide the second power voltage V2 to the common node CN based on a first operation mode signal CMOSEN. The first low voltage supply unit 120 may include a first supply element 121. For example, the first supply element 121 may be an N channel MOS transistor. The first supply element 121 may receive the first operation mode signal CMOSEN at its gate, may be electrically coupled to the common node CN at its drain, and may be electrically coupled to a terminal of the second power voltage V2 at its source.

The second low voltage supply unit 130 may provide the second low voltage to the common node CN in the second operation mode. The second low voltage supply unit 130 may provide the second power voltage V2 to the common node CN based on a second operation mode signal CMLEN and a bias voltage NBIAS. The second low voltage supply unit 130 may generate the second low voltage from the second power voltage V2 based on the bias voltage NBIAS. The second low voltage supply unit 130 may provide the second low voltage to the common node CN based on the second operation mode signal CMLEN. The second low voltage supply unit 130 may include a voltage limit element 131 and a second supply element 132. The voltage limit element 131 may generate the second low voltage having a higher level than the second power voltage V2 based on the bias voltage NBIAS. The voltage limit element 131 may adjust the level of the second low voltage based on the bias voltage NBIAS. The bias voltage NBIAS may have an arbitrary voltage level to adjust the conductivity of the voltage limit element 131. For example, the voltage limit element 131 may be an N channel MOS transistor. The voltage limit element 131 may receive the bias voltage NBIAS at its gate, and may be electrically coupled to the terminal of the second power voltage V2 at its source. The second supply element 132 may provide the second low voltage, which is generated through the voltage limit element 131, to the common node CN based on the second operation mode signal CMLEN. For example, the second supply element 132 may be an N channel MOS transistor. The second supply element 132 may receive the second operation mode signal CMLEN at its gate, may be electrically coupled to the common node CN at its drain, and may be electrically coupled to a drain of the voltage limit element 131 at its source.

Referring to FIG. 1, the hybrid buffer circuit 100 may further include a buffer control circuit 160. The first operation mode signal CMOSEN and the second operation mode signal CMLEN may be generated to indicate the first operation mode and the second operation mode, respectively. The buffer control circuit 160 may generate the first operation mode signal CMOSEN and the second operation mode signal CMLEN based on a mode selection signal MS. For example, the mode selection signal MS may be an arbitrary control signal to be generated based on the operation speed of the semiconductor apparatus. The buffer control circuit 160 will be described further later.

Referring to FIG. 1, the hybrid buffer circuit 100 may further include a gating unit 140. The gating unit 140 may provide the high voltage to one of the first output node PO and the second output node NO based on the input signals IN and INB in the first operation mode. The gating unit 140 may provide the high voltage to the first output node PO and the second output node NO regardless of the input signals IN and INB in the second operation mode. For example, the gating unit 140 may electrically couple a terminal of the first power voltage V1 to the first output node PO and the second output node NO based on the first operation mode signal CMOSEN and the input signals IN and INB. The gating unit 140 may electrically couple the terminal of the first power voltage V1 to one of the first output node PO and the second output node NO based on the input signals IN and INB when the first operation mode signal CMOSEN is enabled. The gating unit 140 may electrically couple the terminal of the first power voltage V1 to both of the first output node PO and the second output node NO when the first operation mode signal CMOSEN is disabled. The gating unit 140 may include a first gating element 141 and a second gating element 142. The first gating element 141 and the second gating element 142 may be P channel MOS transistors. The first gating element 141 may receive a first gating signal GC1 at its gate, may be electrically coupled to the terminal of the first power voltage V1 at its source, and may be electrically coupled to the second output node NO at its drain. The second gating element 142 may receive a second gating signal GC2 at its gate, may be electrically coupled to the terminal of the first power voltage V1 at its source, and may be electrically coupled to the first output node PO at its drain. The buffer control circuit 160 may generate the first gating signal GC1 and the second gating signal GC2 based on the first operation mode signal CMOSEN and the input signals IN and INB.

Referring to FIG. 1, the hybrid buffer circuit 100 may further include a load unit 150. The load unit 150 may be electrically coupled between the terminal of the first power voltage V1 and the gating unit 140. The load unit 150 may include a first resistive element 151 and a second resistive element 152. For example, the first resistive element 151 may have substantially the same resistance value as the second resistive element 152. The first resistive element 151 may be electrically coupled to the terminal of the first power voltage V1 at one end thereof, and may be electrically coupled to the source of the first gating element 141 at the other end thereof. The second resistive element 152 may be electrically coupled to the terminal of the first power voltage V1 at one end thereof, and may be electrically coupled to the source of the second gating element 142 at the other end thereof.

Figure 2:
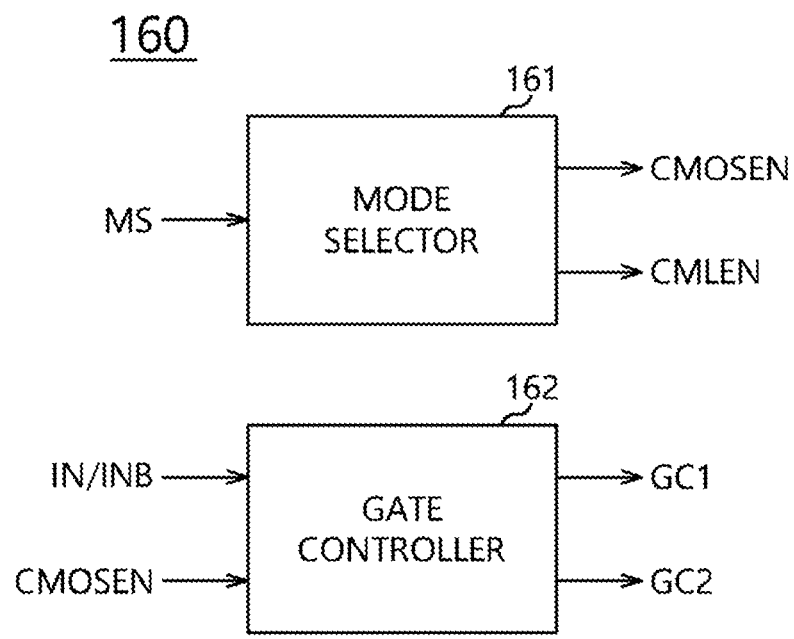
FIG. 2 is a diagram illustrating an example of a configuration of a buffer control circuit illustrated in FIG. 1.

FIG. 2 is a diagram illustrating an example of a configuration of the buffer control circuit 160 illustrated in FIG. 1. Referring to FIG. 2, the buffer control circuit 160 may include a mode selector 161 and a gate controller 162. The mode selector 161 may generate the first operation mode signal CMOSEN and the second operation mode signal CMLEN based on the mode selection signal MS. For example, the mode selection signal MS may have a logic low level in the first operation mode, and the mode selector 161 may enable the first operation mode signal CMOSEN to a high level based on the mode selection signal MS having a logic low level. For example, the mode selection signal MS may have a logic high level in the second operation mode, and the mode selector 161 may enable the second operation mode signal CMLEN to a high level based on the mode selection signal MS having a logic high level.

The gate controller 162 may generate the first gating signal GC1 and the second gating signal GC2 based on the first operation mode signal CMOSEN and the input signals IN and INB. In an embodiment, the gate controller 162 may be modified and/or changed to generate the first gating signal GC1 and the second gating signal GC2 based on the second operation mode signal CMLEN and the input signals IN and INB. The gate controller 162 may enable both of the first gating signal GC1 and the second gating signal GC2 when the first operation mode signal CMOSEN is disabled. The gate controller 162 may enable one of the first gating signal GC1 and the second gating signal GC2 based on the input signals IN and INB when the first operation mode signal CMOSEN is enabled.

Figure 3:
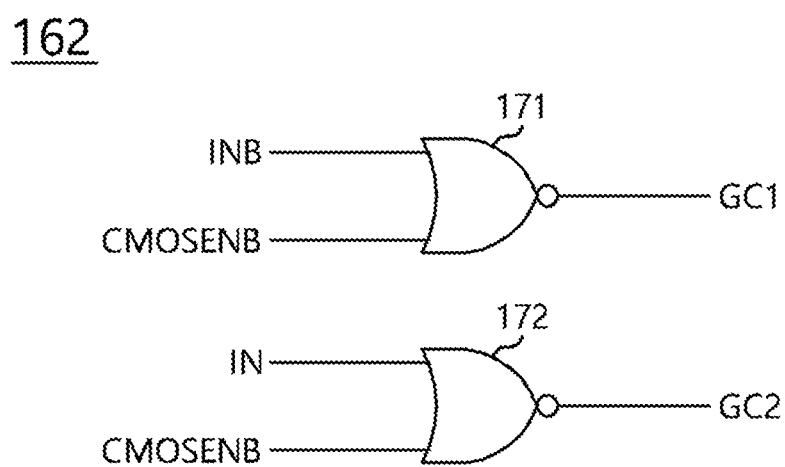
FIG. 3 is a diagram illustrating an example of a configuration of a gate controller illustrated in FIG. 2.

FIG. 3 is a diagram illustrating an example of a configuration of the gate controller 162 illustrated in FIG. 2. Referring to FIG. 3, the gate controller 162 may perform NOR operations. For example, the gate controller 162 may include a first NOR gate 171 and a second NOR gate 172. The first NOR gate 171 may receive the complementary input signal INB and an inverted signal CMOSENB of the first operation mode signal CMOSEN, and may generate the first gating signal GC1. The second NOR gate 172 may receive the positive input signal IN and the inverted signal CMOSENB of the first operation mode signal CMOSEN, and may generate the second gating signal GC2. When the first operation mode signal CMOSEN is disabled to a low level, the first NOR gate 171 and the second NOR gate 172 may enable both of the first gating signal GC1 and the second gating signal GC2 to a low level regardless of the input signals IN and INB. When the first operation mode signal CMOSEN is enabled to a high level and the positive input signal IN has a high level, the first gating signal GC1 may be disabled to a high level and the second gating signal GC2 may be enabled to a low level. When the first operation mode signal CMOSEN is enabled to a high level and the positive input signal IN has a low level, the first gating signal GC1 may be enabled to a low level and the second gating signal GC2 may be disabled to a high level. FIG. 3 illustrates an embodiment of the gate controller 162 implemented with a NOR gate configured to receive the inverted signal CMOSENB of the first operation mode signal CMOSEN and the input signals IN and INB. However, the gate controller 162 may be modified and/or changed to be implemented with various logic circuits. For example, the gate controller 162 may be implemented with an AND gate configured to receive the first operation mode signal CMOSEN and the input signals IN and INB.

Figure 4A:
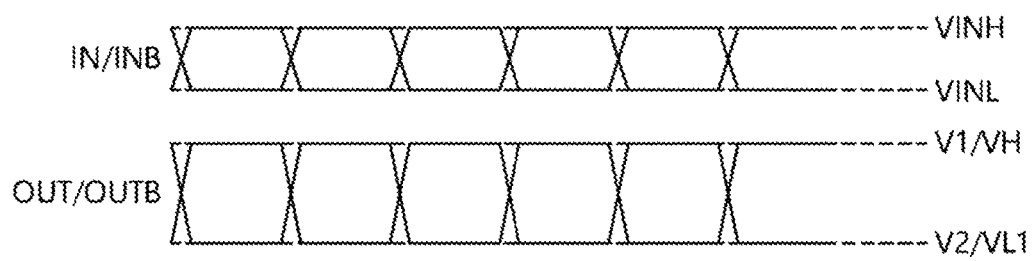
FIGS. 4A and 4B are diagrams illustrating examples of an operation of the hybrid buffer circuit illustrated in FIG. 1.
Figure 4B:
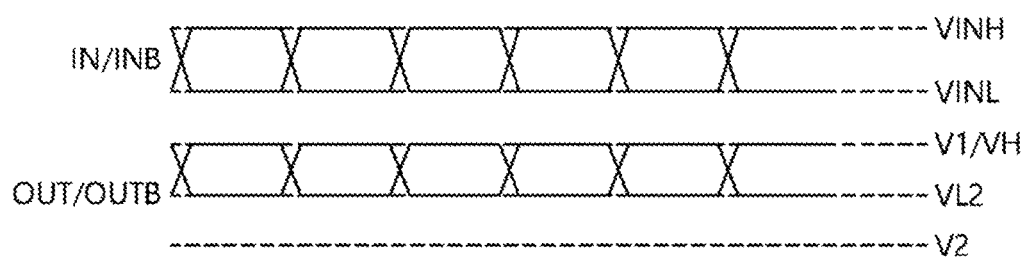

FIGS. 4A and 4B are diagrams illustrating examples of an operation of the hybrid buffer circuit 100 illustrated in FIG. 1. Described hereinafter with reference to FIGS. 1 to 4B will be the operation of the hybrid buffer circuit 100. The mode selection signal MS may have a logic low level to indicate the first operation mode. The mode selector 161 may enable the first operation mode signal CMOSEN to a high level, and may disable the second operation mode signal CMLEN to a low level. The first supply element 121 of the first low voltage supply unit 120 may be turned on based on the first operation mode signal CMOSEN, may electrically couple the terminal of the second power voltage V2 to the common node CN, and may provide a first low voltage VL1 having substantially the same level as the second power voltage V2 to the common node CN. The second supply element 132 of the second low voltage supply unit 130 may be turned off. The high level of each of the input signals IN and INB may be the level of an input high voltage VINH, and the low level of each of the input signals IN and INB may be the level of an input low voltage VINL. The levels of the input high voltage VINH and the input low voltage VINL may vary depending on an embodiment. When the positive input signal IN has a high level and the complementary input signal INB has a low level, the first switching element 111 of the input unit 110 may be turned on and the second switching element 112 may be turned off. The gate controller 162 may disable the first gating signal GC1 to a high level, and may enable the second gating signal GC2 to a low level. The second gating element 142 may be turned on and may provide the high voltage VH, which has substantially the same level as the first power voltage V1, to the first output node PO. The first gating element 141 may be turned off and might not provide the high voltage VH to the second output node NO. Therefore, the first output node PO may be driven by the high voltage VH and the positive output signal OUT having a level corresponding to the high voltage VH may be output from the first output node PO. The second output node NO may be driven by the first low voltage VL1 and the complementary output signal OUTB having a level corresponding to the first low voltage VL1 may be generated from the second output node NO.

When the positive input signal IN has a low level and the complementary input signal INB has a high level, the first switching element 111 of the input unit 110 may be turned off and the second switching element 112 may be turned on. The gate controller 162 may enable the first gating signal GC1 to a low level, and may disable the second gating signal GC2 to a high level. The first gating element 141 may be turned on and may provide the high voltage VH to the second output node NO. The second gating element 142 may be turned off and might not provide the high voltage VH to the first output node PO. Therefore, the first output node PO may be driven by the first low voltage VL1 and the positive output signal OUT having a level corresponding to the first low voltage VL1 may be output from the first output node PO. The second output node NO may be driven by the high voltage VH and the complementary output signal OUTB having a level corresponding to the high voltage VH may be generated from the second output node NO. As illustrated in FIG. 4A, the output signals OUT and OUTB may swing between the high voltage VH and the first low voltage VL1, and may be generated as signals which fully swing substantially between the first power voltage V1 and the second power voltage V2.

The mode selection signal MS may have a logic high level to indicate the second operation mode. The mode selector 161 may disable the first operation mode signal CMOSEN to a low level, and may enable the second operation mode signal CMLEN to a high level. The first supply element 121 of the first low voltage supply unit 120 may be turned off. The voltage limit element 131 of the second low voltage supply unit 130 may generate the second low voltage VL2 having a higher level than the second power voltage V2 based on the bias voltage NBIAS. The second supply element 132 may be turned on based on the second operation mode signal CMLEN, and may provide the second low voltage VL2 to the common node CN. The gate controller 162 may enable both of the first gating signal GC1 and the second gating signal GC2 to a low level based on the disabled first operation mode signal CMOSEN. The first gating element 141 and the second gating element 142 may be kept turned on in the second operation mode. When the positive input signal IN has a high level and the complementary input signal INB has a low level, the first switching element 111 of the input unit 110 may be turned on and the second switching element 112 may be turned off. The first output node PO may be driven by the high voltage VH and the positive output signal OUT having a level corresponding to the high voltage VH may be output from the first output node PO. The second output node NO may be driven by the second low voltage VL2 and the complementary output signal OUTB having a level corresponding to the second low voltage VL2 may be generated from the second output node NO.

When the positive input signal IN has a low level and the complementary input signal INB has a high level, the first switching element 111 of the input unit 110 may be turned off and the second switching element 112 may be turned on. Therefore, the first output node PO may be driven by the second low voltage VL2 and the positive output signal OUT having a level corresponding to the second low voltage VL2 may be output from the first output node PO. The second output node NO may be driven by the high voltage VH and the complementary output signal OUTB having a level corresponding to the high voltage VH may be generated from the second output node NO. As illustrated in FIG. 4B, the output signals OUT and OUTB may swing between the high voltage VH and the second low voltage VL2, and may be generated as signals which swing substantially between the first power voltage V1 and the second low voltage VL2. Therefore, the output signals OUT and OUTB may have less swing width in the second operation mode than in the first operation mode.

Figure 5:
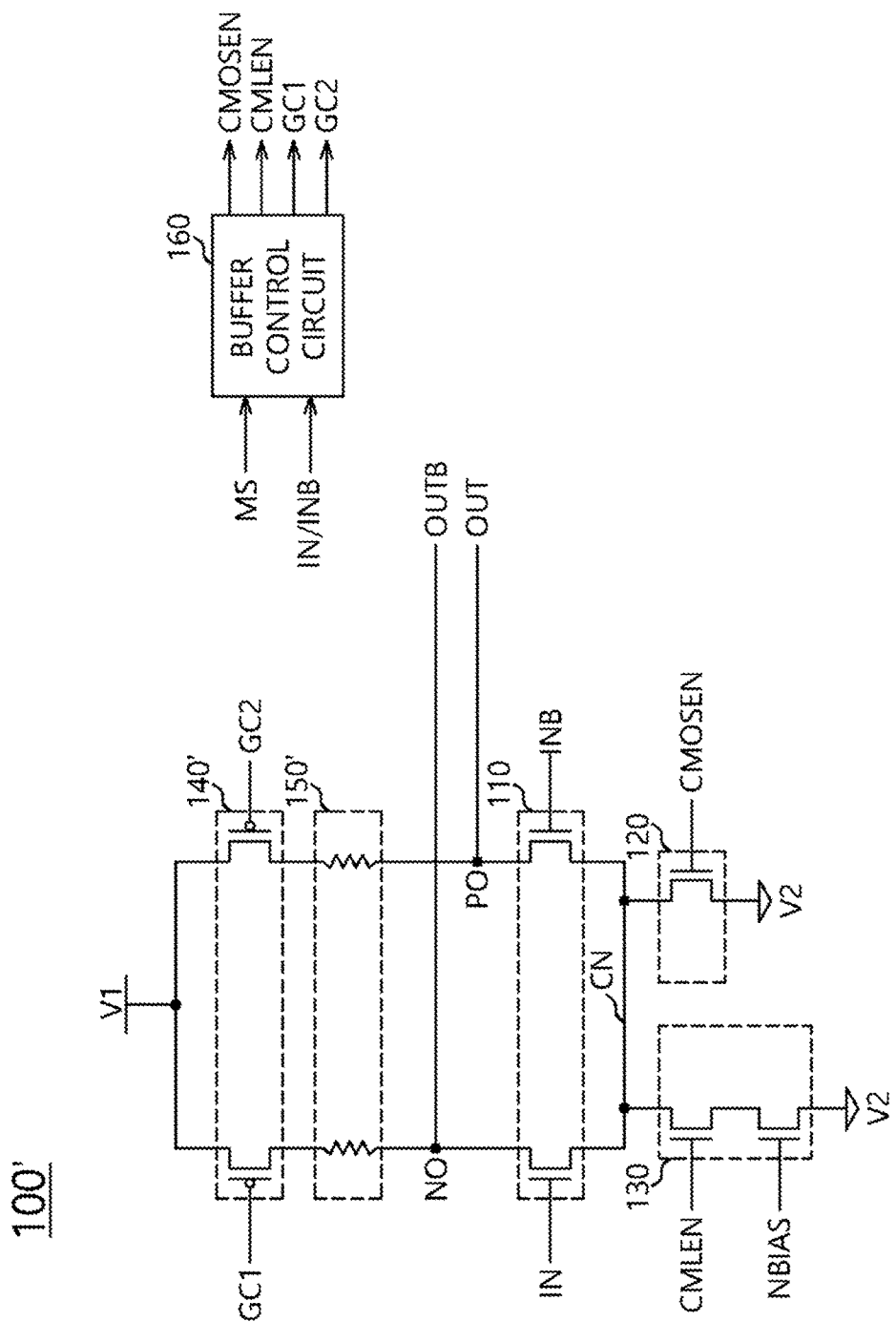
FIG. 5 is a diagram illustrating an example of a configuration of a hybrid buffer circuit in accordance with an embodiment of the present disclosure.

FIG. 5 is a diagram illustrating an example of a configuration of a hybrid buffer circuit 100' in accordance with an embodiment of the present disclosure. The hybrid buffer circuit 100' of FIG. 5 may be substantially the same as the hybrid buffer circuit 100 of FIG. 1 except for coupling relationships of some elements. The hybrid buffer circuit 100' may generate the output signals OUT and OUTB by changing the voltage levels of the first output node PO and the second output node NO based on the input signals IN and INB. The hybrid buffer circuit 100' may include the input unit 110, the first low voltage supply unit 120, the second low voltage supply unit 130, a gating unit 140', a load unit 150', and the buffer control circuit 160. Hereinafter, the elements, signals, and voltages of the hybrid buffer circuit 100', which are the same as those of the hybrid buffer circuit 100 of FIG. 1, will not be described again. The hybrid buffer circuit 100' of FIG. 5 and the hybrid buffer circuit 100 of FIG. 1 may differ from each other by the coupling relationship of the gating unit 140' and the load unit 150'. In the hybrid buffer circuit 100' of FIG. 5, the gating unit 140' may be electrically coupled to the terminal of the first power voltage V1 and the load unit 150' may be electrically coupled between the gating unit 140' and the first output node PO and the second output node NO. The hybrid buffer circuit 100' of FIG. 5 may have the gating unit 140' electrically coupled between the first power voltage V1 and the load unit 150' thereby the effect of parasitic capacitance and/or inherent resistance may be reduced.

Figure 6:
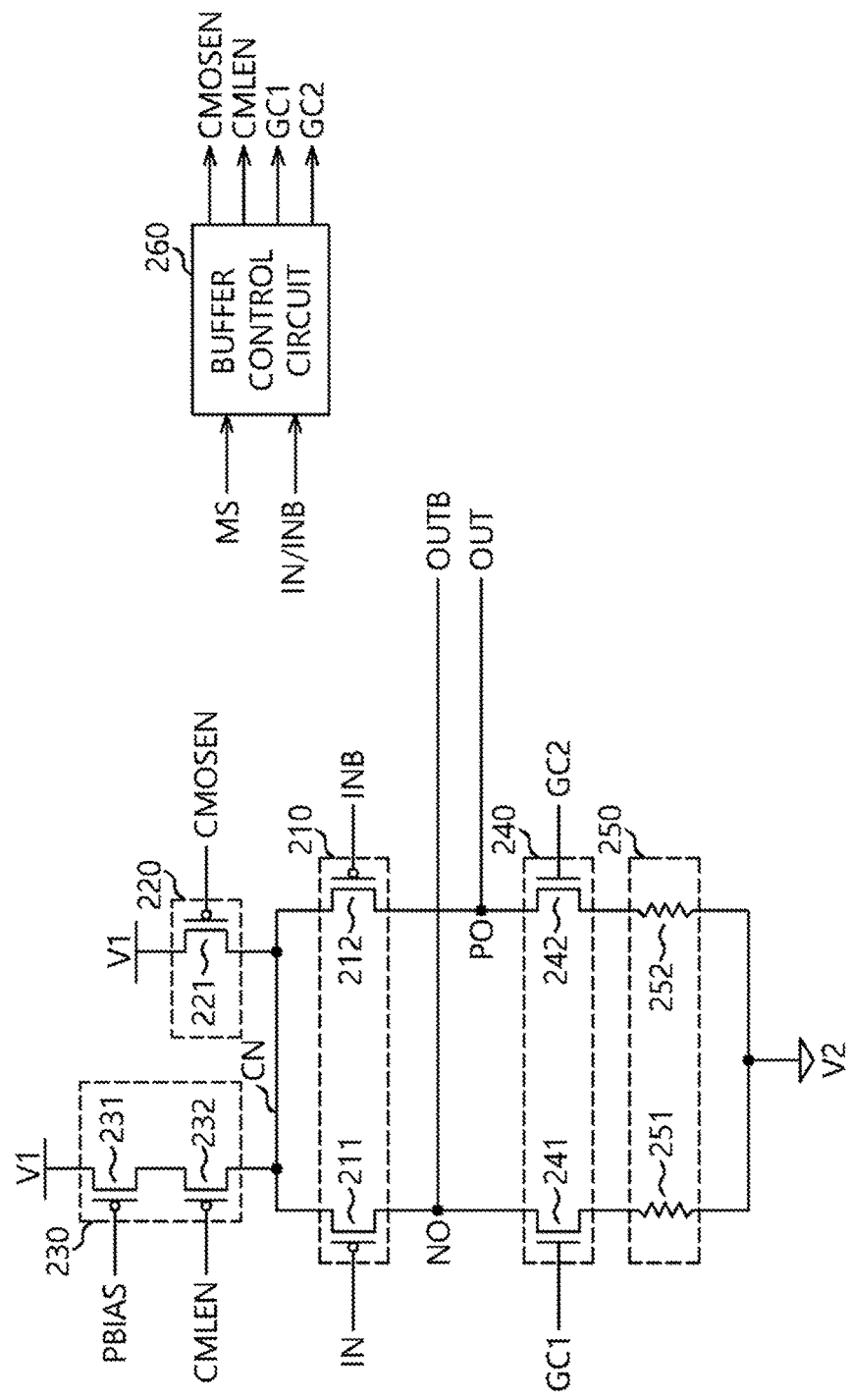
FIG. 6 is a diagram illustrating an example of a configuration of a hybrid buffer circuit in accordance with an embodiment of the present disclosure.

FIG. 6 is a diagram illustrating an example of a configuration of a hybrid buffer circuit 200 in accordance with an embodiment of the present disclosure. Referring to FIG. 6, characteristics of the elements in the hybrid buffer circuit 200 may be oppositely symmetrical to those in the hybrid buffer circuit 100 described with reference to FIG. 1. Therefore, technical characteristics and operation schemes of the hybrid buffer circuit 200 may be substantially the same as the hybrid buffer circuit 100. Referring to FIG. 6, the hybrid buffer circuit 200 may include an input unit 210. The input unit 210 may receive the input signals IN and INB, and may electrically couple the first output node PO and the second output node NO to the common node CN based on the input signals IN and INB. The input unit 210 may change the voltage levels of the first output node PO and the second output node NO based on the input signals IN and INB. The hybrid buffer circuit 200 may provide a low voltage to the first output node PO and the second output node NO based on the input signals IN and INB in the first operation mode. The hybrid buffer circuit 200 may provide a first high voltage to the common node CN in the first operation mode. For example, the low voltage may have substantially the same level as the second power voltage V2. For example, the first high voltage may have substantially the same level as the first power voltage V1. Therefore, the hybrid buffer circuit 200 may generate, through the first output node PO and the second output node NO based on the input signals IN and INB, the output signals OUT and OUTB swinging between the first high voltage and the low voltage in the first operation mode.

The hybrid buffer circuit 200 may provide the low voltage to the first output node PO and the second output node NO regardless of the input signals IN and INB in the second operation mode. The hybrid buffer circuit 200 may provide a second high voltage to the common node CN in the second operation mode. For example, the second high voltage may have a lower level than the first high voltage. The second high voltage may have a level lower than the first power voltage V1 and higher than the second power voltage V2. Therefore, the hybrid buffer circuit 200 may generate, through the first output node PO and the second output node NO based on the input signals IN and INB, the output signals OUT and OUTB swinging between the second high voltage and the low voltage in the second operation mode.

The input unit 210 may include a first switching element 211 and a second switching element 212. The first switching element 211 and the second switching element 212 may be P channel MOS transistors. The first switching element 211 may receive the positive input signal IN at its gate, may be electrically coupled to the second output node NO at its drain, and may be electrically coupled to the common node CN at its source. The second switching element 212 may receive the complementary input signal INB at its gate, may be electrically coupled to the first output node PO at its drain, and may be electrically coupled to the common node CN at its source.

Referring to FIG. 6, the hybrid buffer circuit 200 may further include a first high voltage supply unit 220 and a second high voltage supply unit 230. The first high voltage supply unit 220 may provide the first high voltage to the common node CN in the first operation mode. The first high voltage supply unit 220 may provide the first power voltage V1 to the common node CN based on a first operation mode signal CMOSEN. The first high voltage supply unit 220 may include a first supply element 221. For example, the first supply element 221 may be a P channel MOS transistor. The first supply element 221 may receive the first operation mode signal CMOSEN at its gate, may be electrically coupled to the common node CN at its drain, and may be electrically coupled to a terminal of the first power voltage V1 at its source.

The second high voltage supply unit 230 may provide the second high voltage to the common node CN in the second operation mode. The second high voltage supply unit 230 may provide the second high voltage to the common node CN based on a second operation mode signal CMLEN and a bias voltage PBIAS. The second high voltage supply unit 230 may generate the second high voltage from the first power voltage V1 based on the bias voltage PBIAS. The second high voltage supply unit 230 may provide the second high voltage to the common node CN based on the second operation mode signal CMLEN. The second high voltage supply unit 230 may include a voltage limit element 231 and a second supply element 232. The voltage limit element 231 may generate the second high voltage having a lower level than the first power voltage V1 based on the bias voltage PBIAS. The voltage limit element 231 may adjust the level of the second high voltage based on the bias voltage PBIAS. The bias voltage PBIAS may have an arbitrary voltage level to adjust the conductivity of the voltage limit element 231. For example, the voltage limit element 231 may be a P channel MOS transistor. The voltage limit element 231 may receive the bias voltage PBIAS at its gate, and may be electrically coupled to the terminal of the first power voltage V1 at its source. The second supply element 232 may provide the second high voltage, which is generated through the voltage limit element 231, to the common node CN based on the second operation mode signal CMLEN. For example, the second supply element 232 may be a P channel MOS transistor. The second supply element 232 may receive the second operation mode signal CMLEN at its gate, may be electrically coupled to the common node CN at its drain, and may be electrically coupled to a drain of the voltage limit element 231 at its source.

Referring to FIG. 6, the hybrid buffer circuit 200 may further include a buffer control circuit 260. The buffer control circuit 260 may generate the first operation mode signal CMOSEN and the second operation mode signal CMLEN based on a mode selection signal MS. For example, the buffer control circuit 260 may generate the first operation mode signal CMOSEN enabled to a low level and the second operation mode signal CMLEN disabled to a high level based on the mode selection signal MS having a low level in the first operation mode. For example, the buffer control circuit 260 may generate the first operation mode signal CMOSEN disabled to a high level and the second operation mode signal CMLEN enabled to a low level based on the mode selection signal MS having a high level in the second operation mode.

Referring to FIG. 6, the hybrid buffer circuit 200 may further include a gating unit 240. The gating unit 240 may provide the low voltage to one of the first output node PO and the second output node NO based on the input signals IN and INB in the first operation mode. The gating unit 240 may provide the low voltage to the first output node PO and the second output node NO regardless of the input signals IN and INB in the second operation mode. For example, the gating unit 240 may electrically couple a terminal of the second power voltage V2 to the first output node PO and the second output node NO based on the first operation mode signal CMOSEN and the input signals IN and INB. The gating unit 240 may electrically couple the terminal of the second power voltage V2 to one of the first output node PO and the second output node NO based on the input signals IN and INB when the first operation mode signal CMOSEN is enabled. The gating unit 240 may electrically couple the terminal of the second power voltage V2 to both of the first output node PO and the second output node NO when the first operation mode signal CMOSEN is disabled. The gating unit 240 may include a first gating element 241 and a second gating element 242. The first gating element 241 and the second gating element 242 may be N channel MOS transistors. The first gating element 241 may receive a first gating signal GC1 at its gate, may be electrically coupled to the terminal of the second power voltage V2 at its source, and may be electrically coupled to the second output node NO at its drain. The second gating element 242 may receive a second gating signal GC2 at its gate, may be electrically coupled to the terminal of the second power voltage V2 at its source, and may be electrically coupled to the first output node PO at its drain.

The buffer control circuit 260 may generate the first gating signal GC1 and the second gating signal GC2 based on the first operation mode signal CMOSEN and the input signals IN and INB. For example, the buffer control circuit 260 may enable the first gating signal GC1 and the second gating signal GC2 to a high level regardless of the input signals IN and INB when the second operation mode signal CMLEN is enabled to a low level. For example, the buffer control circuit 260 may enable the first gating signal GC1 to a high level and may disable the second gating signal GC2 to a low level when the first operation mode signal CMOSEN is enabled to a low level, the positive input signal IN has a high level and the complementary input signal has a low level. For example, the buffer control circuit 260 may disable the first gating signal GC1 to a low level and may enable the second gating signal GC2 to a high level when the first operation mode signal CMOSEN is enabled to a low level, the positive input signal IN has a low level and the complementary input signal has a high level.

Referring to FIG. 6, the hybrid buffer circuit 200 may further include a load unit 250. The load unit 250 may be electrically coupled between the terminal of the second power voltage V2 and the gating unit 240. The load unit 250 may include a first resistive element 251 and a second resistive element 252. The first resistive element 251 may be electrically coupled to the terminal of the second power voltage V2 at one end thereof, and may be electrically coupled to the source of the first gating element 241 at the other end thereof. The second resistive element 252 may be electrically coupled to the terminal of the second power voltage V2 at one end thereof, and may be electrically coupled to the source of the second gating element 242 at the other end thereof.

Figure 7A:
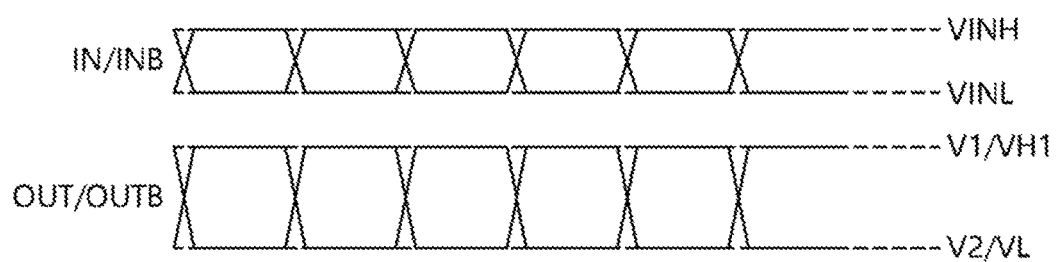
FIGS. 7A and 7B are diagrams illustrating examples of an operation of the hybrid buffer circuit illustrated in FIG. 6.
Figure 7B:
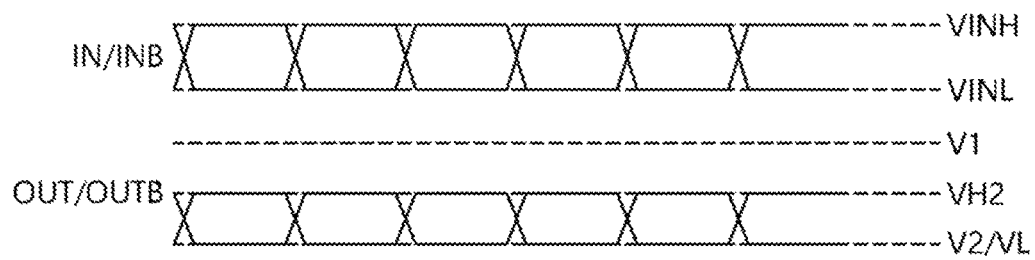

FIGS. 7A and 7B are diagrams illustrating examples of an operation of the hybrid buffer circuit 200 illustrated in FIG. 6. Described hereinafter with reference to FIGS. 6 to 7B will be the operation of the hybrid buffer circuit 200. The mode selection signal MS may have a logic low level to indicate the first operation mode. The hybrid buffer circuit 200 may enable the first operation mode signal CMOSEN to a low level, and may disable the second operation mode signal CMLEN to a high level. The first supply element 221 of the first high voltage supply unit 220 may be turned on based on the first operation mode signal CMOSEN, may electrically couple the terminal of the first power voltage V1 to the common node CN, and may provide a first high voltage VH1 having substantially the same level as the first power voltage V1 to the common node CN. The second supply element 232 of the second high voltage supply unit 230 may be turned off. The high level of each of the input signals IN and INB may be the level of an input high voltage VINH, and the low level of each of the input signals IN and INB may be the level of an input low voltage VINL. When the positive input signal IN has a low level and the complementary input signal INB has a high level, the first switching element 211 of the input unit 210 may be turned on and the second switching element 212 may be turned off. The second gating element 242 may be turned on and may provide the low voltage VL, which has substantially the same level as the second power voltage V2, to the first output node PO. The first gating element 241 may be turned off and might not provide the low voltage VL to the second output node NO. Therefore, the first output node PO may be driven by the low voltage VL and the positive output signal OUT having a level corresponding to the low voltage VL may be output from the first output node PO. The second output node NO may be driven by the first high voltage VH1 and the complementary output signal OUTB having a level corresponding to the first high voltage VH1 may be generated from the second output node NO.

When the positive input signal IN has a high level and the complementary input signal INB has a low level, the first switching element 211 of the input unit 210 may be turned off and the second switching element 212 may be turned on. The first gating element 241 may be turned on and may provide the low voltage VL having substantially the same level as the second power voltage V2 to the second output node NO. The second gating element 242 may be turned off and might not provide the low voltage VL to the first output node PO. Therefore, the first output node PO may be driven by the first high voltage VH1 and the positive output signal OUT having a level corresponding to the first high voltage VH1 may be output from the first output node PO. The second output node NO may be driven by the low voltage VL and the complementary output signal OUTB having a level corresponding to the low voltage VL may be generated from the second output node NO. As illustrated in FIG. 7A, the output signals OUT and OUTB may swing between the first high voltage VH1 and the low voltage VL, and may be generated as signals which fully swing substantially between the first power voltage V1 and the second power voltage V2.

The mode selection signal MS may have a logic high level to indicate the second operation mode. The buffer control circuit 260 may disable the first operation mode signal CMOSEN to a high level, and may enable the second operation mode signal CMLEN to a low level. The first supply element 221 of the first high voltage supply unit 220 may be turned off. The voltage limit element 231 of the second high voltage supply unit 230 may generate the second high voltage VH2 having a lower level than the first power voltage V1 based on the bias voltage PBIAS. The second supply element 232 may be turned on based on the second operation mode signal CMLEN, and may provide the second high voltage VH2 to the common node CN. The first gating element 241 and the second gating element 242 may be kept turned on in the second operation mode. When the positive input signal IN has a low level and the complementary input signal INB has a high level, the first switching element 211 of the input unit 210 may be turned on and the second switching element 212 may be turned off. The first output node PO may be driven by the low voltage VL and the positive output signal OUT having a level corresponding to the low voltage VL may be output from the first output node PO. The second output node NO may be driven by the second high voltage VH2 and the complementary output signal OUTB having a level corresponding to the second high voltage VH2 may be generated from the second output node NO.

When the positive input signal IN has a high level and the complementary input signal INB has a low level, the first switching element 211 of the input unit 210 may be turned off and the second switching element 212 may be turned on. Therefore, the first output node PO may be driven by the second high voltage VH2 and the positive output signal OUT having a level corresponding to the second high voltage VH2 may be output from the first output node PO. The second output node NO may be driven by the low voltage VL and the complementary output signal OUTB having a level corresponding to the low voltage VL may be generated from the second output node NO. As illustrated in FIG. 7B, the output signals OUT and OUTB may swing between the second high voltage VH2 and the low voltage VL, and may be generated as signals which swing substantially between the second high voltage VH2 and the second power voltage V2. Therefore, the output signals OUT and OUTB may have less swing width in the second operation mode than in the first operation mode.

FIG. 8 is a diagram illustrating an example of a configuration of a hybrid buffer circuit 300 in accordance with an embodiment of the present disclosure. Referring to FIG. 8, the hybrid buffer circuit 300 may be a combination of parts of the hybrid buffer circuits 100 and 200 described with reference to FIGS. 1 and 6. Therefore, technical characteristics and operation schemes of the hybrid buffer circuit 300 may be substantially the same as the hybrid buffer circuits 100 and 200. Referring to FIG. 8, the hybrid buffer circuit 300 may include an input unit 310. The input unit 310 may receive the input signals IN and INB, and may electrically couple the first output node PO and the second output node NO to a first common node CN1 and a second common node CN2, respectively, based on the input signals IN and INB. The input unit 310 may generate output signals OUT and OUTB by changing the voltage levels of the first output node PO and the second output node NO based on the input signals IN and INB. According to the operation mode, the hybrid buffer circuit 300 may provide one of a first high voltage and a second high voltage to the first common node CN1, and may provide one of a first low voltage and a second low voltage to the second common node CN2. The first high voltage may have substantially the same level as the first power voltage V1, and the second high voltage may have a lower level than the first high voltage. The first low voltage may have substantially the same level as the second power voltage V2, and the second low voltage may have a level higher than the first low voltage and lower than the second high voltage. In the first operation mode, the hybrid buffer circuit 300 may provide the first high voltage to the first common node CN1, and may provide the first low voltage to the second common node CN2. In the second operation mode, the hybrid buffer circuit 300 may provide the second high voltage to the first common node CN1, and may provide the second low voltage to the second common node CN2.

The hybrid buffer circuit 300 may provide the first high voltage and the first low voltage to the first output node PO and the second output node NO, respectively, based on the input signals IN and INB in the first operation mode. The input unit 310 may electrically couple the first output node PO and the second output node NO to the first common node CN1 and the second common node CN2, respectively, based on the input signals IN and INB. Therefore, the hybrid buffer circuit 300 may generate, through the first output node PO and the second output node NO based on the input signals IN and INB, the output signals OUT and OUTB swinging between the first high voltage and the first low voltage in the first operation mode. The hybrid buffer circuit 300 may provide the second high voltage and the second low voltage to the first output node PO and the second output node NO, respectively, based on the input signals IN and INB in the second operation mode. The input unit 310 may electrically couple the first output node PO and the second output node NO to the first common node CN1 and the second common node CN2, respectively, based on the input signals IN and INB. Therefore, the hybrid buffer circuit 300 may generate, through the first output node PO and the second output node NO based on the input signals IN and INB, the output signals OUT and OUTB swinging between the second high voltage and the second low voltage in the second operation mode.

The input unit 310 may include a first switching element 311A, a second switching element 312A, a third switching element 311B, and a fourth switching element 312B. The first switching element 311A and the third switching element 311B may be P channel MOS transistors. The second switching element 312A and the fourth switching element 312B may be N channel MOS transistors. The first switching element 311A may receive the positive input signal IN at its gate, may be electrically coupled to the second output node NO at its drain, and may be electrically coupled to the first common node CN1 at its source. The second switching element 312A receive the positive input signal IN at its gate, may be electrically coupled to the second output node NO at its drain, and may be electrically coupled to the second common node CN2 at its source. The third switching element 311B may receive the complementary input signal INB at its gate, may be electrically coupled to the first output node PO at its drain, and may be electrically coupled to the first common node CN1 at its source. The fourth switching element 312B may receive the complementary input signal INB at its gate, may be electrically coupled to the first output node PO at its drain, and may be electrically coupled to the second common node CN2 at its source.

Referring to FIG. 8, the hybrid buffer circuit 300 may further include a first low voltage supply unit 320A, a second low voltage supply unit 330A, a first high voltage supply unit 320B and a second high voltage supply unit 330B. The first low voltage supply unit 320A may provide the first low voltage to the second common node CN2 in the first operation mode. The first low voltage supply unit 320A may provide the second power voltage V2 to the second common node CN2 based on a first operation mode signal CMOSEN. The first low voltage supply unit 320A may include a first low voltage supply element 321A. For example, the first low voltage supply element 321A may be an N channel MOS transistor. The first low voltage supply element 321A may receive the first operation mode signal CMOSEN at its gate, may be electrically coupled to the second common node CN2 at its drain, and may be electrically coupled to a terminal of the second power voltage V2 at its source.

The second low voltage supply unit 330A may provide the second low voltage to the second common node CN2 in the second operation mode. The second low voltage supply unit 330A may provide the second low voltage to the second common node CN2 based on a second operation mode signal CMLEN and a bias voltage NBIAS. The second low voltage supply unit 330A may generate the second low voltage from the second power voltage V2 based on the bias voltage NBIAS. The second low voltage supply unit 330A may provide the second low voltage to the second common node CN2 based on the second operation mode signal CMLEN. The second low voltage supply unit 330A may include a low voltage limit element 331A and a second low voltage supply element 332A. The low voltage limit element 331A may generate the second low voltage having a higher level than the second power voltage V2 based on the bias voltage NBIAS. The low voltage limit element 331A may adjust the level of the second low voltage based on the bias voltage NBIAS. For example, the low voltage limit element 331A may be an N channel MOS transistor. The low voltage limit element 331A may receive the bias voltage NBIAS at its gate, and may be electrically coupled to the terminal of the second power voltage V2 at its source. The second low voltage supply element 332A may provide the second low voltage, which is generated through the low voltage limit element 331A, to the second common node CN2 based on the second operation mode signal CMLEN. For example, the second low voltage supply element 332A may be an N channel MOS transistor. The second low voltage supply element 332A may receive the second operation mode signal CMLEN at its gate, may be electrically coupled to the second common node CN2 at its drain, and may be electrically coupled to a drain of the low voltage limit element 331A at its source.

The first high voltage supply unit 320B may provide the first high voltage to the first common node CN1 in the first operation mode. The first high voltage supply unit 320B may provide the first power voltage V1 to the first common node CN1 based on the first operation mode signal CMOSEN. The first high voltage supply unit 320B may include a first high voltage supply element 321B. For example, the first high voltage supply element 321B may be a P channel MOS transistor. The first high voltage supply element 321B may receive the inverted signal CMOSENB of the first operation mode signal CMOSEN at its gate, may be electrically coupled to the first common node CN1 at its drain, and may be electrically coupled to the terminal of the first power voltage V1 at its source.

The second high voltage supply unit 330B may provide the second high voltage to the first common node CN1 in the second operation mode. The second high voltage supply unit 330B may provide the second high voltage to the first common node CN1 based on the second operation mode signal CMLEN and a bias voltage PBIAS. The second high voltage supply unit 330B may generate the second high voltage from the first power voltage V1 based on the bias voltage PBIAS. The second high voltage supply unit 330B may provide the second high voltage to the first common node CN1 based on the second operation mode signal CMLEN. The second high voltage supply unit 330B may include a high voltage limit element 331B and a second high voltage supply element 332B. The high voltage limit element 331B may generate the second high voltage having a lower level than the first power voltage V1 based on the bias voltage PBIAS. The high voltage limit element 331B may adjust the level of the second high voltage based on the bias voltage PBIAS. For example, the high voltage limit element 331B may be a P channel MOS transistor. The high voltage limit element 331B may receive the bias voltage PBIAS at its gate, and may be electrically coupled to the terminal of the first power voltage V1 at its source. The second high voltage supply element 332B may provide the second high voltage, which is generated through the high voltage limit element 331B, to the first common node CN1 based on the second operation mode signal CMLEN. For example, the second high voltage supply element 332B may be a P channel MOS transistor. The second high voltage supply element 332B may receive the inverted signal CMLENB of the second operation mode signal CMLEN at its gate, may be electrically coupled to the first common node CN1 at its drain, and may be electrically coupled to a drain of the high voltage limit element 331B at its source.

Referring to FIG. 8, the hybrid buffer circuit 300 may further include a buffer control circuit 360. The buffer control circuit 360 may generate the first operation mode signal CMOSEN and the second operation mode signal CMLEN based on a mode selection signal MS. For example, the buffer control circuit 360 may generate the first operation mode signal CMOSEN enabled to a high level and the second operation mode signal CMLEN disabled to a low level based on the mode selection signal MS having a low level in the first operation mode. For example, the buffer control circuit 360 may generate the first operation mode signal CMOSEN disabled to a low level and the second operation mode signal CMLEN enabled to a high level based on the mode selection signal MS having a high level in the second operation mode.

Figure 9A:
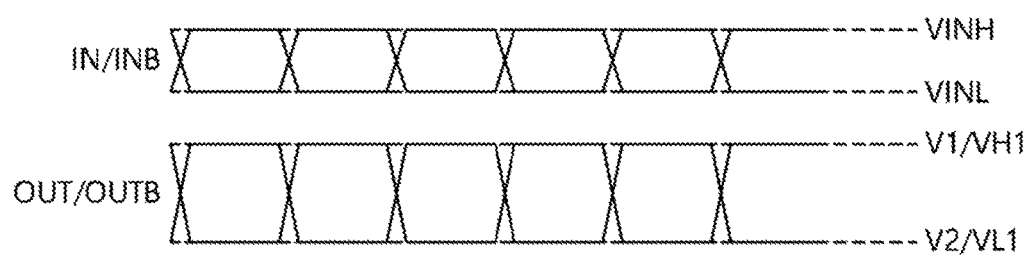
FIGS. 9A and 9B are diagrams illustrating examples of an operation of the hybrid buffer circuit illustrated in FIG. 8.
Figure 9B:
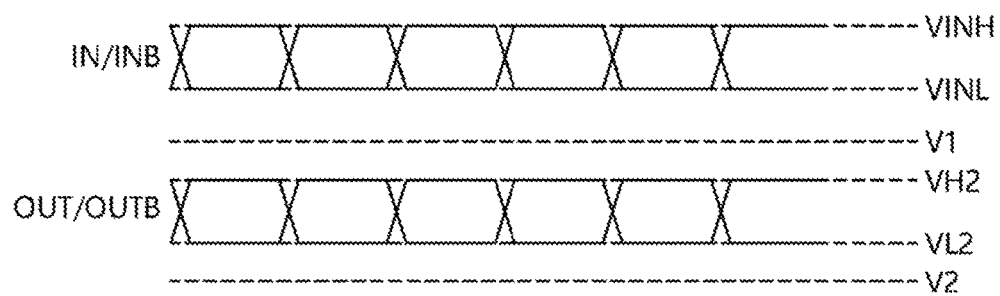

FIGS. 9A and 9B are diagrams illustrating examples of an operation of the hybrid buffer circuit 300 illustrated in FIG. 8. Described hereinafter with reference to FIGS. 8 to 9B will be the operation of the hybrid buffer circuit 300. The mode selection signal MS may have a logic low level to indicate the first operation mode. The hybrid buffer circuit 300 may enable the first operation mode signal CMOSEN to a high level, and may disable the second operation mode signal CMLEN to a low level. The first low voltage supply element 321A of the first low voltage supply unit 320A may be turned on based on the first operation mode signal CMOSEN, may electrically couple the terminal of the second power voltage V2 to the second common node CN2, and may provide a first low voltage VL1 having substantially the same level as the second power voltage V2 to the second common node CN2. The first high voltage supply element 321B of the first high voltage supply unit 320B may be turned on based on the inverted signal CMOSENB of the first operation mode signal CMOSEN, may electrically couple the terminal of the first power voltage V1 to the first common node CN1, and may provide a first high voltage VH1 having substantially the same level as the first power voltage V1 to the first common node CN1. The second low voltage supply element 332A of the second low voltage supply unit 330A and the second high voltage supply element 332B of the second high voltage supply unit 330B may be turned off.

The high level of each of the input signals IN and INB may be the level of an input high voltage VINH, and the low level of each of the input signals IN and INB may be the level of an input low voltage VINL. When the positive input signal IN has a low level and the complementary input signal INB has a high level, the first switching element 311A and the fourth switching element 312B of the input unit 310 may be turned on and the second switching element 312A and the third switching element 311B may be turned off. Therefore, the first output node PO may be driven by the first low voltage VL1 and the positive output signal OUT having a level corresponding to the first low voltage VL1 may be output from the first output node PO. The second output node NO may be driven by the first high voltage VH1 and the complementary output signal OUTB having a level corresponding to the first high voltage VH1 may be generated from the second output node NO.

When the positive input signal IN has a high level and the complementary input signal INB has a low level, the second switching element 312A and the third switching element 311B of the input unit 310 may be turned on and the first switching element 311A and the fourth switching element 312B of the input unit 310 may be turned off. Therefore, the first output node PO may be driven by the first high voltage VH1 and the positive output signal OUT having a level corresponding to the first high voltage VH1 may be output from the first output node PO. The second output node NO may be driven by the first low voltage VL1 and the complementary output signal OUTB having a level corresponding to the first low voltage VL1 may be generated from the second output node NO. As illustrated in FIG. 9A, the output signals OUT and OUTB may swing between the first high voltage VH1 and the first low voltage VL1, and may be generated as signals which fully swing substantially between the first power voltage V1 and the second power voltage V2.

The mode selection signal MS may have a logic high level to indicate the second operation mode. The buffer control circuit 360 may disable the first operation mode signal CMOSEN to a low level, and may enable the second operation mode signal CMLEN to a high level. The first low voltage supply element 321A of the first low voltage supply unit 320A and the first high voltage supply element 321B of the first high voltage supply unit 320B may be turned off. The low voltage limit element 331A of the second low voltage supply unit 330A may generate the second low voltage VL2 having a higher level than the second power voltage V2 based on the bias voltage NBIAS. The second low voltage supply element 332A may be turned on based on the second operation mode signal CMLEN, and may provide the second low voltage VL2 to the second common node CN2. The high voltage limit element 331B of the second high voltage supply unit 330B may generate the second high voltage VH2 having a lower level than the first power voltage V1 based on the bias voltage PBIAS. The second high voltage supply element 332B may be turned on based on the inverted signal CMLENB of the second operation mode signal CMLEN, and may provide the second high voltage VH2 to the first common node CN1.

The high level of each of the input signals IN and INB may be the level of an input high voltage VINH, and the low level of each of the input signals IN and INB may be the level of an input low voltage VINL. When the positive input signal IN has a low level and the complementary input signal INB has a high level, the first switching element 311A and the fourth switching element 312B of the input unit 310 may be turned on and the second switching element 312A and the third switching element 311B may be turned off. The first output node PO may be driven by the second low voltage VL2 and the positive output signal OUT having a level corresponding to the second low voltage VL2 may be output from the first output node PO. The second output node NO may be driven by the second high voltage VH2 and the complementary output signal OUTB having a level corresponding to the second high voltage VH2 may be generated from the second output node NO.

When the positive input signal IN has a high level and the complementary input signal INB has a low level, the first switching element 311A and the fourth switching element 312B of the input unit 310 may be turned off and the second switching element 312A and the third switching element 311B of the input unit 310 may be turned on. Therefore, the first output node PO may be driven by the second high voltage VH2 and the positive output signal OUT having a level corresponding to the second high voltage VH2 may be output from the first output node PO. The second output node NO may be driven by the second low voltage VL2 and the complementary output signal OUTB having a level corresponding to the second low voltage VL2 may be generated from the second output node NO. As illustrated in FIG. 9B, the output signals OUT and OUTB may swing between the second high voltage VH2 and the second low voltage VL2. Therefore, the output signals OUT and OUTB may have less swing width in the second operation mode than in the first operation mode.

While certain embodiments have been described above, it will be understood to those skilled in the art that the embodiments described are by way of example only. Accordingly, the hybrid buffer circuit should not be limited based on the described embodiments.

What is claimed is:

1. A buffer circuit comprising:
an input unit configured to electrically couple a first output node and a second output node to a common node based on an input signal,
wherein the buffer circuit is configured to provide a high voltage to one of the first and second output nodes based on the input signal in a first operation mode, and configured to provide a first low voltage to the common node in the first operation mode, and
wherein the buffer circuit is configured to provide the high voltage to both of the first and second output nodes in a second operation mode, and configured to provide a second low voltage having a different level from the first low voltage to the common node in the second operation mode.

2. The buffer circuit of claim 1, wherein the high voltage has substantially the same level as a first power voltage, and the first low voltage has substantially the same level as a second power voltage having a lower level than the first power voltage.

3. The buffer circuit of claim 2, wherein the second low voltage has a level higher than the first low voltage and lower than the first power voltage.

4. The buffer circuit of claim 1, further comprising a gating unit configured to provide the high voltage to the one of the first and second output nodes based on the input signal in the first operation mode, and configured to provide the high voltage to both of the first and second output nodes in the second operation mode.

5. The buffer circuit of claim 1, wherein the first operation mode is entered based on a first operation mode signal, and the high voltage is provided to the one of the first and second output nodes based on the first operation mode signal and the input signal.

6. The buffer circuit of claim 4, further comprising a load unit electrically coupled between the gating unit and a terminal of the first power voltage, and configured to provide the high voltage.

7. The buffer circuit of claim 4, further comprising a load unit electrically coupled between the gating unit, and the first and second output nodes.

8. The buffer circuit of claim 2, further comprising:
a first low voltage supply unit configured to provide the first low voltage to the common node in the first operation mode; and
a second low voltage supply unit configured to generate the second low voltage from the second power voltage and to provide the second low voltage to the common node in the second operation mode.

9. The buffer circuit of claim 8, wherein the second low voltage supply unit includes:
a voltage limit element configured to generate the second low voltage from the second power voltage based on a bias voltage; and
a supply element configured to provide the second low voltage to the common node in the second operation mode.

10. A buffer circuit comprising:
an input unit electrically coupled between a first output node, a second output node, and a common node, and configured to change voltage levels of the first and second output nodes based on an input signal,
wherein the buffer circuit is configured to provide a first high voltage to the common node in a first operation mode, and configured to provide a low voltage to one of the first and second output nodes based on the input signal in the first operation mode, and
wherein the buffer circuit is configured to provide a second high voltage having a different level from the first high voltage to the common node in a second operation mode, and configured to provide the low voltage to both of the first and second output nodes in the second operation mode.

11. The buffer circuit of claim 10, wherein the first high voltage has substantially the same level as a first power voltage, and the low voltage has substantially the same level as a second power voltage having a lower level than the first power voltage.

12. The buffer circuit of claim 11, wherein the second high voltage has a level lower than the first high voltage and higher than the second power voltage.

13. The buffer circuit of claim 10, further comprising a gating unit configured to provide the low voltage to the one of the first and second output nodes based on the input signal in the first operation mode, and configured to provide the low voltage to both of the first and second output nodes in the second operation mode.

14. The buffer circuit of claim 13, further comprising a load unit electrically coupled between the gating unit and a terminal of the second power voltage, and configured to provide the low voltage.

15. The buffer circuit of claim 11, further comprising:
a first high voltage supply unit configured to provide the first high voltage to the common node in the first operation mode; and
a second high voltage supply unit configured to generate the second high voltage from the first power voltage and to provide the second high voltage to the common node in the second operation mode.

16. The buffer circuit of claim 15, wherein the second high voltage supply unit includes:
a voltage limit element configured to generate the second high voltage from the first power voltage based on a bias voltage; and
a supply element configured to provide the second high voltage to the common node in the second operation mode.

17. A buffer circuit comprising:
an input unit electrically coupled between a first output node, a second output node, and a common node, and configured to change voltage levels of the first and second output nodes based on an input signal;
a gating unit configured to provide a high voltage to the first and second output nodes based on a first operation mode signal and the input signal;
a first low voltage supply unit configured to provide a first low voltage to the common node based on the first operation mode signal; and
a second low voltage supply unit configured to provide a second low voltage having a different level from the first low voltage to the common node based on a second operation mode signal and a bias voltage.

18. The buffer circuit of claim 17, wherein the high voltage has substantially the same level as a first power voltage, and the first low voltage has substantially the same level as a second power voltage having a lower level than the first power voltage.

19. The buffer circuit of claim 18, wherein the second low voltage has a level higher than the first low voltage and lower than the first power voltage.

20. The buffer circuit of claim 17, wherein the input unit includes:
a first switching element electrically coupled between the second output node and the common node, and configured to electrically couple the second output node and the common node based on the input signal; and
a second switching element electrically coupled between the first output node and the common node, and configured to electrically couple the first output node and the common node based on a complementary signal of the input signal.

21. The buffer circuit of claim 18, wherein the gating unit includes:
a first gating element configured to provide the first power voltage as the high voltage to the second output node based on a first gating signal; and
a second gating element configured to provide the first power voltage as the high voltage to the first output node based on a second gating signal,
wherein the first and second gating signals are generated based on the first operation mode signal and the input signal.

22. The buffer circuit of claim 21,
wherein the first and second gating elements provide the high voltage to one of the first and second output nodes based on the input signal when the first operation mode signal is enabled; and
wherein the first and second gating elements provide the high voltage to both of the first and second output nodes when the first operation mode signal is disabled.

23. The buffer circuit of claim 21, further comprising a buffer control circuit configured to generate the first operation mode signal, the second operation mode signal, the first gating signal, and the second gating signal based on a mode selection signal and the input signal.

24. The buffer circuit of claim 17, wherein the first low voltage supply unit includes a first supply element configured to provide the first low voltage to the common node based on the first operation mode signal.

25. The buffer circuit of claim 24, wherein the second low voltage supply unit includes:

a voltage limit element configured to receive the bias voltage, and to generate the second low voltage having a higher level than the second power voltage; and a second supply element configured to provide the second low voltage generated from the voltage limit element to the common node based on the second operation mode signal.

26. The buffer circuit of claim 18, further comprising a load unit electrically coupled between the gating unit and a terminal of the first power voltage.

27. A buffer circuit comprising:

an input unit electrically coupled between first and second common nodes, and configured to change voltage levels of first and second output nodes based on an input signal;

a first high voltage supply unit configured to provide the first high voltage to the first common node in a first operation mode; and a second high voltage supply unit configured to generate the second high voltage from the first power voltage and to provide the second high voltage to the first common node in a second operation mode, wherein the second high voltage supply unit includes a voltage limit element configured to generate the second high voltage from the first power voltage based on a bias voltage, and a supply element configured to provide the second high voltage to the first common node in the second operation mode.

28. The buffer circuit of claim 27, wherein the buffer circuit is configured to provide the first high voltage to the first common node in the first operation mode, and configured to provide the first low voltage to the second common node in the first operation mode, and wherein the buffer circuit is configured to provide the second high voltage to the first common node in the second operation mode, and configured to provide the second low voltage to the second common node in the second operation mode.

29. The buffer circuit of claim 27, wherein the first high voltage has substantially the same level as a first power voltage, and the first low voltage has substantially the same level as a second power voltage, and wherein the second high voltage has a lower level than the first high voltage, and the second low voltage has a level higher than the first low voltage and lower than the second high voltage.

30. The buffer circuit of claim 27, wherein the input unit includes:

a first switching element configured to electrically couple the second output node and the first common node based on a positive input signal;

a second switching element electrically configured to electrically couple the second output node and the second common node based on the positive input signal;

a third switching element configured to electrically couple the first output node and the first common node based on a complementary input signal; and a fourth switching element electrically configured to electrically couple the first output node and the second common node based on the complementary input signal.

31. The buffer circuit of claim 27, further comprising:

a first low voltage supply unit configured to provide the first low voltage to the second common node in a first operation mode; and a second low voltage supply unit configured to generate the second low voltage from the second power voltage and to provide the second low voltage to the second common node in a second operation mode.

32. The buffer circuit of claim 31, wherein the second low voltage supply unit includes:

a voltage limit element configured to generate the second low voltage from the second power voltage based on a bias voltage; and a supply element configured to provide the second low voltage to the second common node in the second operation mode.

\* \* \* \* \*